United States Patent [19]

Stokar

[11] Patent Number: 4,966,149
[45] Date of Patent: Oct. 30, 1990

[54] REDUCING THE EFFECTS OF COHERENCE IN MAGNETIC RESONANCE IMAGING

[75] Inventor: Saul Stokar, Raanana, Israel
[73] Assignee: Elscint Ltd., Haifa, Israel
[21] Appl. No.: 463,780
[22] Filed: Jan. 8, 1990

Related U.S. Application Data

[63] Continuation of Ser. No. 159,125, Feb. 23, 1988, abandoned.

[51] Int. Cl.⁵ .............................................. A61B 5/055
[52] U.S. Cl. .................................. 128/653 A; 324/309
[58] Field of Search ................... 128/653 A; 324/307, 324/309

[56] References Cited

U.S. PATENT DOCUMENTS

| | | |
|---|---|---|
| 4,727,882 | 3/1988 | Schneider et al. ................. 128/653 |
| 4,740,749 | 4/1988 | Yamamoto et al. ................. 324/309 |
| 4,770,182 | 9/1988 | Damadian et al. ................. 128/653 |
| 4,779,620 | 10/1988 | Zimmermann et al. ............ 128/653 |

OTHER PUBLICATIONS

L. Axel, "Respiratory Effects in Two Dimensional Fourier Transform MR Imaging", published in the *Journal of Radiology*, vol. 160, pp. 795-801 (1986).

*Primary Examiner*—Ruth S. Smith
*Assistant Examiner*—John D. Zele
*Attorney, Agent, or Firm*—Sandler, Greenblum & Bernstein

[57] ABSTRACT

An unique external averaging system for reducing the coherence of acquired data used for magnetic resonance imaging. The averaging is done after the acquisition of substantially complete matrices of data.

7 Claims, 4 Drawing Sheets

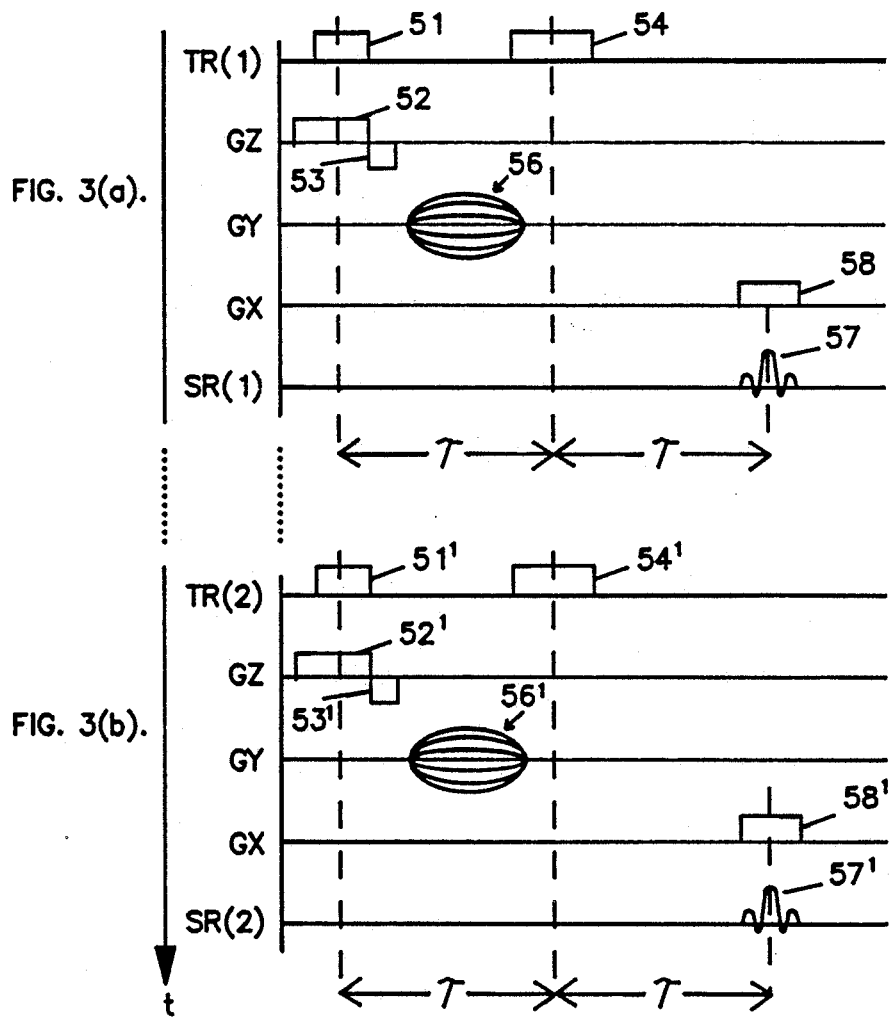

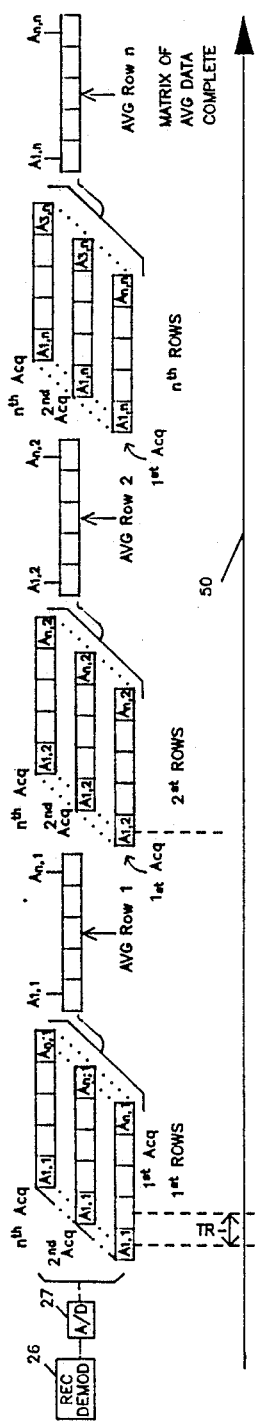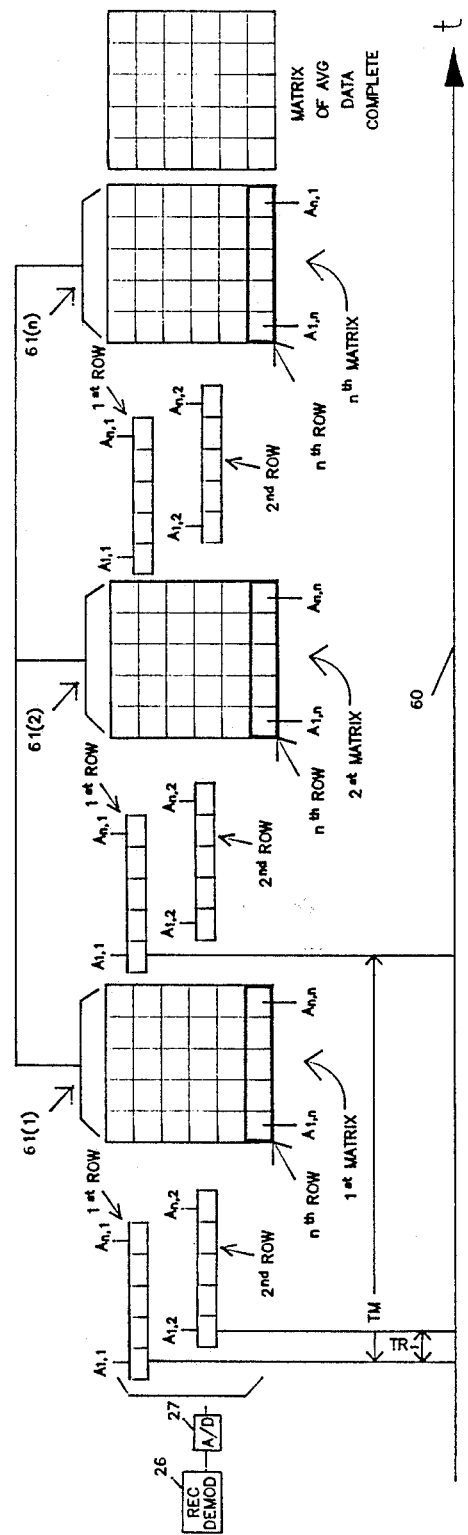

REDUCING THE EFFECTS OF COHERENCE IN MAGNETIC RESONANCE IMAGING

This application is a continuation, of application Ser. No. 07/159,125, filed Feb. 23, 1988 now abandoned.

FIELD OF THE INVENTION

This invention is concerned with magnetic resonance imaging (MRI) systems and more particularly with apparatus and methods for reducing artifacts caused by quasi-periodic motion in portion of the subject being imaged.

BACKGROUND OF THE INVENTION

Images acquired by magnetic resonance are seriously degraded by quasi-periodic motion in the subject. The best example of quasi-periodic motion is the breathing of a patient, however, there are other examples, such as but not limited to pulsitile blood flow. The scan sequence collected data that is effected by respiratory and other regular motions that are operated on by Fourier transforms produce image artifacts consisting of local blurring and more or less regularly spaced "ghost" images propagating along the direction of the phase encoding magnetic field gradient.

The prior art methods for reducing the artifacts caused by quasi-periodic motion include apparatus and methods of data acquisition which cause the acquired data to assume a quasi-linear function rather than the quasi-cyclical function. This is done, for example, by reordering the phase encoding gradient pulses. Instead of the usual sequential application of phase encoding pulses with different amplitudes, the gradient amplitudes are selected as a function of the physical position of the moving portion of the body being imaged. Such correction methods require additional transducers for sensing the position of the thorax of the patient for example and means for reordering the phase encoding gradients. In addition, "a learning period" is usually required in the reordering methods to determine the average displacement of the moving portions of the body. The learning period, of course, adds time to the scan sequence and lowers the throughput capability of the system.

An alternative method of correcting for the respiratory effects in two-dimensional Fourier transform MR imaging was described in an article by L. Axel et al entitled "Respiratory Effects in two Dimensional Fourier Transform MR Imaging" published in the Journal of Radiology, volume 160, pages pp795–801 (1986). The method described in that article uses averaging to overcome the adverse respiratory effects on the two-dimensional Fourier transformed image. More particularly, a pulse sequence including a phase encoding gradient having a first amplitude is used to obtain an echo signal. This step with the encoding gradient having the first amplitude is repeated a plurality of times. The output echo signals are then averaged to attempt to flatten the otherwise quasi-periodic modulation produced by the respiratory motion. Subsequently, the sequence is run a number of times with a second phase encoding gradient pulse amplitude. The echoes are again averaged. The scan sequences are run in this manner until an entire matrix of signal data is acquired.

The actual number of times in which the same phase encoding pulse amplitude is used is given by the quotient of TP/TR; where TP is the period of the quasi-cyclical motion and TR is the time to repeat of the scan sequence. For example, the respiration period is in the order of 4,000 milliseconds. A typical time to repeat is 500 milliseconds, therefore, the number of samples to be averaged will 8. In other words, each of the echo acquisitions is repeated 8 times in a typical example. There are circumstances when 6 times will accomplish the task of flattening the periodicity of the respiratory motion. Similarly on some subjects 16 samples will be required to flatten out the quasi-cyclical motion. Thus, the averaging system for reducing motion artifacts caused by quasi-periodic motion requires more acquisition time than a typical reordering system. Accordingly, when using the prior art averaging schemes transducers or gating equipment are not needed during the scans, they are needed to measure the total breathing movement. Also, the prior art averaging does increase the imaging time. Accordingly, scientists in the field are still searching for apparatus and methods for overcoming or at least more efficiently reducing the ghosting and blurring artifacts caused by quasi-periodic motion in the patient being imaged by magnetic resonance systems.

BRIEF DESCRIPTION OF THE INVENTION

In accordance with the present invention an MRI method is provided which cancels the effects of coherence periodicity of motion on Fourier transformed data; said system comprising:
  acquiring a plurality of two-dimensional matrices of signals, said matrices comprising a plurality of defined areas corresponding to image pixels,
  said acquiring step including applying a plurality of different phase encoding pulses for completing the acquisition of said two-dimensional matrices of signals,
  repeating the same sequence using the same plurality of phase encoding pulses,
  averaging the acquired signals for each of the defined areas in the plurality of two-dimensional matrices, and
  using the averaged acquired signal for reconstructing an image.
In accordance with a feature of the present invention said plurality of two-dimensional matrices comprise at least two matrices.
A further feature of the present invention includes averaging prior to performing Fourier transform operations on the acquired data.
In accordance with yet another feature of the present invention the averaging is performed after the Fourier transform operations on the acquired data.

DESCRIPTION OF THE DRAWINGS

The above mentioned and other objects and features of the present invention will be better understood when considered with the following description of a broad aspect of the invention made with reference to the accompanying drawings wherein:

FIG. 3 is a showing of the present inventive "external averaging" spin echo scan sequence used to overcome the artifacts caused by the quasi-periodic motion;

FIG. 4 is a showing of the receiver portion of the prior art "internal averaging" system; and FIG. 5 is a showing of the receiver portion of the "external averaging" system of the present invention.

GENERAL DESCRIPTION

Figure 1:
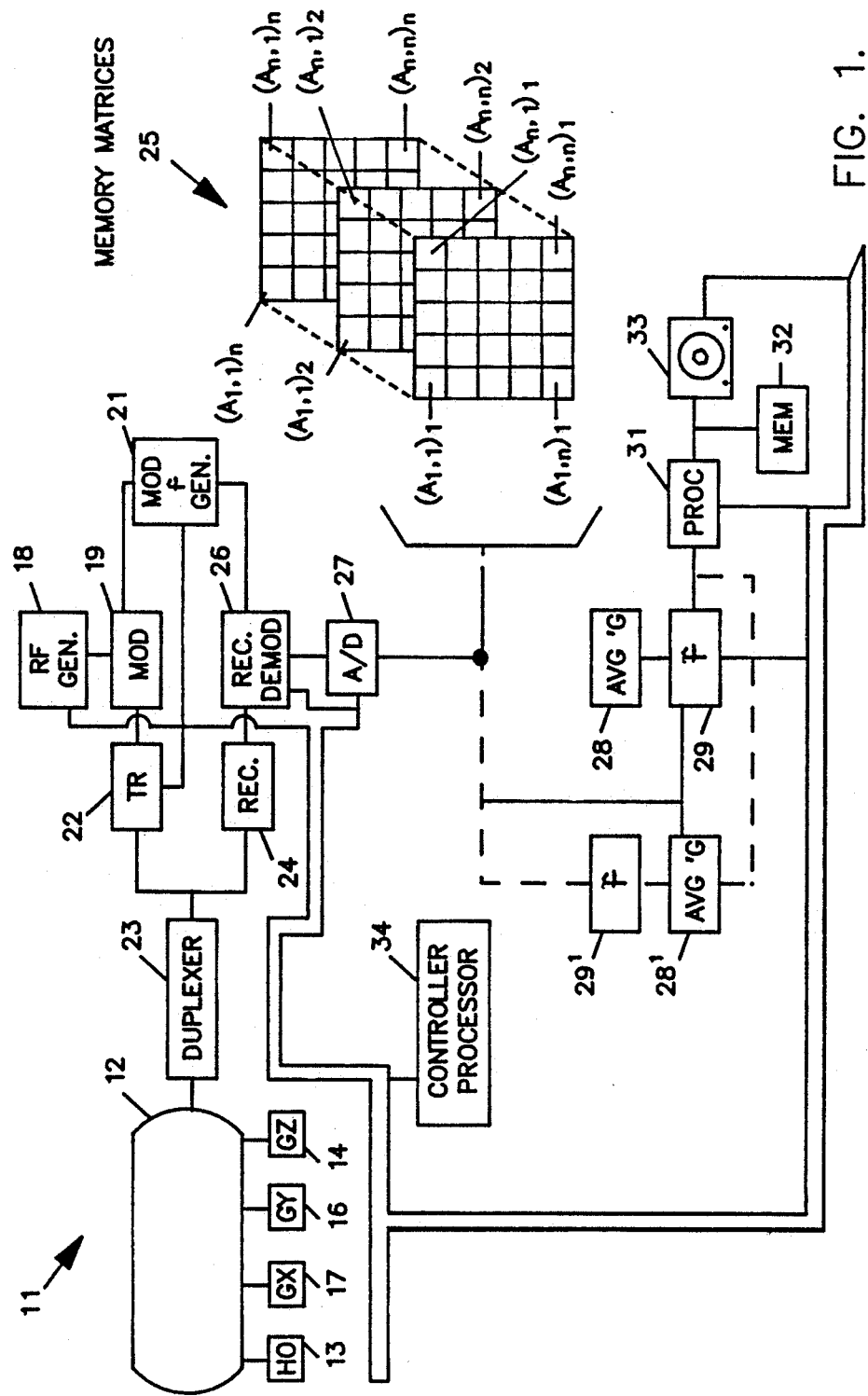
FIG. 1 is a magnetic resonance imaging system according to the invention for use in acquiring data for imaging.

FIG. 1 at 11 shows a typical MRI system improved with components for performing "external averaging". The MRI system 11 comprises a large magnet 12, for generating a large static magnetic field needed in MRI procedures. The large static magnetic field is generated responsive to operation of the magnetic field generator 13 shown as block HO. To obtain imaging location information, gradient fields are applied by energizing the gradient field generators shown as Z gradient generator GZ at 14, the Y gradient generator GY at 16 and the X gradient generator GX shown at 17.

As is well known, certain nuclei or "spins" are magnetically aligned by the large static magnetic field and in the direction of the large static field, conventionally set in the Z axis direction. A radio frequency (RF) pulse applied to the spins orthogonal to the Z axis "tips" the spins into the XY plane or so that at least a portion of the tipped spins are in the XY plane. When the RF pulse signal is removed then free induction decay (FID) signals are generated as the spins return to their aligned position. Preferably manipulations of gradient and RF pulses are accomplished to provide echo signals.

The RF pulse is applied responsive to the operation of the RF generator 18 which provides an RF frequency pulse that is shaped by modulater 19 responsive to an output of a modulation frequency generator 21. The shaped RF pulse is sent by transmitter 22 through a duplexer circuit 23 which assures that the transmitter and receiver do not interfere with each other. The signal from the duplexer is sent to an RF coil (not shown) in the magnet 12. The FID or echo signals are received through the duplexer by the receiver 24 and the receiver demodulator 26. The demodulator 26 receives a demodulating frequency input from the modulator frequency generator 21 and demodulates the received signal. The demodulated received signal is operated on by the analog to digital converter 27 to provide digital received signals.

In accordance with this invention "external averaging" is accomplished on the digital signals by the averaging circuit 28. External averaging is used herein to mean averaging accomplished using the amplitudes of the signals in similarly located defined areas corresponding to pixels in images in a plurality of multi-dimensional signal data matrices after the matrices have been completed. The defined areas are sometimes referred to herein as pixels. The prior art averaging ("internal averaging"), in contrast, acquires all of the data for the defined areas or pixels in the first rows in a plurality of two dimensional matrices. The data of similarly located pixels in the first rows are averaged. This step is repeated for each of the rows. Thus, the prior art completes each row of the plurality of matrices and moves on to the next row of the plurality of matrices until a complete matrix of averaged data is obtained. With external averaging instead of averaging row by row the matrices are completed before averaging of the similarly located pixels is accomplished.

To emphasize this difference FIG. 1 shows a plurality of k two-dimensional matrices 25. The matrices are divided into a multiplicity of pixels such as pixels Ai, j, .... Where i represents columns and j represents the rows. Both i and j are integers 1,2, ... n. The similarly located pixels Ai, j of the matrices k where k is also integers 1,2 ... n, are averaged after the multiplicity of matrices are filled with data.

The averaged signals are operated on by a Fourier transform operator 29 to transform the time domain signals into frequency domain signals. The frequency domain signals are processed by image processor 31 using image memory 32. Finally, the image is displayed on display unit 33. All of this is done under the control of the controller processor shown at 34. The controller-processor provides proper timing signals and controls the external averaging and the amplitude, shape and time location of RF pulses and of the magnetic gradient field pulses. In accordance with the invention the averaging indicated by the dashed line showing of FIG. 1 can also be accomplished in block 28' after the digitized and sampled signal is operated on by block 29'.

In the prior art systems the averaging is done on the similarly located pixels in each row of the plurality of rows of the plurality of matrices. That is, each amplitude of the phase encoding gradient pulses is repeated a plurality of times to obtain a plurality of similarly located rows of data prior to changing the phase encoding pulse amplitude.

The operational difference between internal and external averaging is shown in a comparison of FIGS. 2 and 3. FIG. 2 shows a prior art data acquisition and averaging scheme. Therein a spin echo sequence is shown in sequence graphs a, b and n. In each of the graphs a first RF pulse 41 is shown. In a preferred embodiment pulse 41 is a 90 degree pulse, that is, it tips the spins 90 degrees from the Z axis into the XY plane. The radio frequency pulse 41 is applied during the application of a slice selecting gradient pulse applied along the Z axis. This gradient pulse is shown at 42, having the usual negative going portion 43. Subsequent to the application of the 90 degree pulse 41, a phase encoding gradient pulse 44 is applied. The phase encoding gradient is typically a Y gradient pulse. The phase is proportional to the amplitude of the phase encoding pulse.

After the application of the phase encoding pulse 44 a second RF pulse 46 is applied. The second RF pulse is typically a 180 degree pulse and it operates to revert the dephasing of the spins in the XY plane so that an echo signal 48 occurs at a time tau ($\tau$) after the application of the 180 degree pulse, 46. The time tau is equal to the time between the application of the 90 degree pulse and the 180 degree pulse. A view selecting pulse GX is shown at 47 as being applied during the acquisition of the echo signal.

Figures 2A, 2B, 2C:
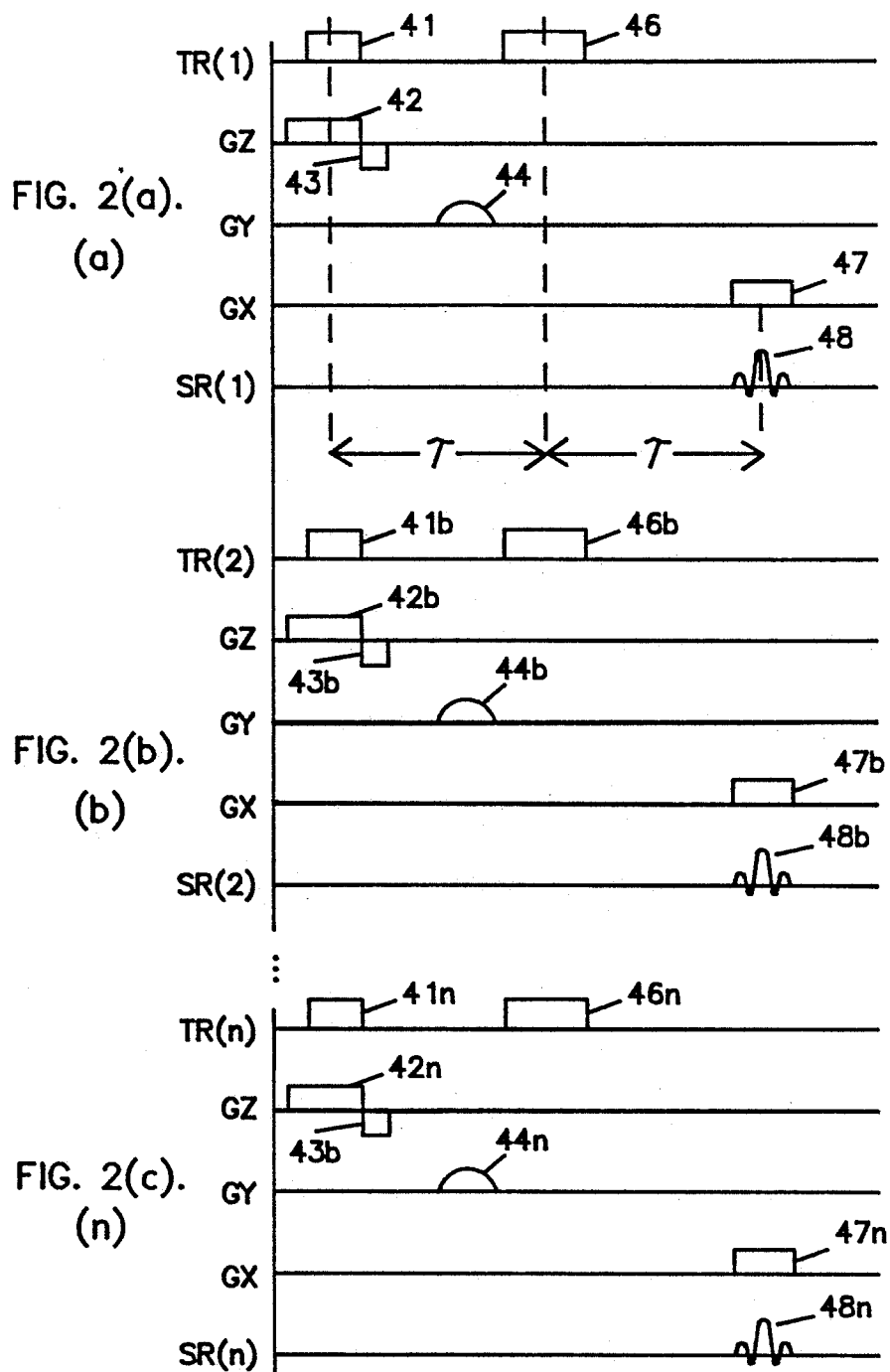
FIG. 2 shows a prior art spin echo sequence wherein averaging is used in an attempt to overcome motion artifacts.

The echo sequence shown in 2a is repeated in FIG. 2b using the same timing and amplitude parameters for each of the pulses. The exact sequence is in fact repeated a number of times n. The echo signals of the n repetitions are used in obtaining the average echo. Thus, as shown in FIG. 2b a 90 degree pulse 41b is applied which is equal in amplitude and timing to pulse 41 of FIG. 2a. It is applied during the application of a slice selecting pulse 42b having a negative going portion 43b which duplicate the pulse portions 42 and 43 of FIG. 2a. Similarly, the phase encoding pulse 44b has the same amplitude and timing parameters as the pulse 44 of FIG. 2a. At a time tau after the application of the 90 degree pulse 41b, a 180 degree pulse 46b is applied. At the time tau after the application of the 180 degree pulse 46b the echo signal 48b is received during the application of a view selecting pulse 47b having the same characteristics a pulse 47.

FIG. 2n shows that the same sequence is duplicated n times to obtain echo sequences for averaging purposes. The averaging done in this manner is referred to herein as internal averaging; that is, the echoes received from each row with the same phase encoding pulse are added together divided by the number of echoes received for that row. In other words, the data for row number 1 of all of the n matrices is acquired n times using equal phase encoding pulses and then the echoes are averaged. Subsequently, row number 2 with phase encoding pulse (2) different than the phase encoding pulse of row 1, is repeated n times and the echoes averaged. The data acquisition for all of the rows including row number n with phasing encoding pulse (2) is repeated n times and the echoes are averaged for each of the rows in this internal manner. As noted in the Axel et al article approximately 8 echo signals are acquired and averaged for each pixel to flatten the cyclical nature of the motion.

FIG. 4 is another way of illustrating internal averaging. As shown therein the echo signals received by receiver demodulator 26 are digitized by the A-to-D converter 27. The converter 27 first supplies the data to individual rows for averaging purposes. Only the average values go into the complete matrix. As shown by the time scale 50, a plurality of first rows are averaged, then a plurality of second rows are averaged and a plurality of third rows are averaged until a plurality of the bottom or nth rows of the matrices are averaged. The result is a matrix of averaged signals. Each signal in the row that is being averaged have the same column location but are removed from each other in time by a factor that is the time to repeat TR.

The method of external averaging has been found to flatten the periodocity of the acquired signals with only two or three readings rather than the prior art's eight readings.

By way of contrast, FIGS. 3a and b show the scan sequences used for external averaging (i.e. averaging after complete matrices of data are acquired.) in accordance with this invention. More particularly, FIG. 3a shows a 90 degree pulse 51, being applied during the application of a slice selecting gradient 52 having a negative going portion 53. At a time tau after the application of the 90 degree pulse, a 180 degree pulse 54 is applied. Between the application of the 90 degree pulse and the 180 degree pulse, a phase encoding gradient pulse 56 is applied. More particularly, one pulse having an amplitude for determining the phase of the phase encoding gradient pulse is applied. At a time tau after the application of 180 degree pulse an echo signal 57 is received during the application of the view gradient pulse 58. The scan sequence is repeated a plurality of times with different amplitude phase encoding pulses applied each time. A row of data is acquired per amplitude of phase encoding pulses. A complete matrix of data is acquired which in a preferred embodiment comprises 256×256 areas of data conforming to pixels of the image to be displayed. Then the sequence is repeated with the plurality of different amplitude encoding pulses being applied in the same order and magnitude and using the gradient pulses and RF pulses of FIG. 3a. Thus FIG. 3b shows the 90 degree pulse 51' and 180 degree pulse 54'. The 90 degree pulse 51' is applied during application of the gradient pulse 52' having a negative portion 53'. The multiplicity of phase encoding pulses are shown at 56' and the echo signal 57' is normally read during the application of a view encoding gradient 58'. In contrast to FIG. 2 entire matrices of data are acquired prior to the averaging process, whereas, in FIG. 2 only entire rows of data are acquired before doing the averaging. In FIG. 2 the data is acquired per row and the rows are then averaged. In FIG. 3 the data is acquired per total matrix and the equivalent pixels of the matrices are averaged.

The difference between external and internal averaging is also highlighted by the showing of FIG. 5 where the receiver-demodulator 26 and the analog to digital converter 27 are shown. However, the output of the analog to digital converter in FIG. 5 are 2-D matrices of data values; whereas, in FIG. 4 the output of the A to D circuit are rows of data values.

The matrices of data values are shown at 61(1), 61(2), and 61(n) in FIG. 5. Both the scan sequence scheme of FIGS. 2, 4 and the scan sequence scheme of FIGS. 3, 5 enable averaging. However, it has been found that the averaging of FIGS. 2, 4 requires a relatively large number of samples for averaging in order to cancel the cyclical nature or coherence of the acquired signal; whereas with the averaging of FIGS. 3, 5 only two or three matrices need to be averaged to cancel the coherence. It is also interesting to note that data averaged such as A1,1 of the different matrices as shown in FIG. 5 are separated by a much larger tile period TM than the TR time period separating the data such as A1,1 of the different acquisitions as shown in FIG. 4.

In operation then, the acquisition of data for filling a plurality of entire matrices is done before the averaging. The averaging finds ideal usage in minimizing artifacts due to the quasi-cyclical motion in parts of the patient being imaged.

While the invention has been described with reference to an embodiment of the invention it should be understood that the description is given by way of example only and is not to act to limit the scope of the invention as defined by the accompanying claims.

What is claimed is:

1. A magnetic resonance imaging system in which the effect in a displayed image of modulation produced by quasi-periodic motion of a subject being imaged is reduced (MRI), said system comprising:

MRI data acquiring means for acquiring a plurality of multi-dimensional signals from a portion of the subject, means for digitizing said multi-dimensional signals, means for reducing the effect of modulation produced by quasi-periodic motion of the subject, said reducing means comprising:

means for storing said digitized signals in areas of a plurality of multi-dimensional matrices as pixel data, each of said areas being defined by specific rows and specific columns of each of said multi-dimensional matrices, said areas corresponding to pixels in a displayed image, controller means for averaging pixel data from the same specific rows and specific columns in each of said plurality of matrices after the data for all of the matrices has been acquired, and means for reconstructing an image using the averaged pixel data.

2. The magnetic resonance system of claim 1 wherein said plurality of matrices comprises less than TP/TR matrices where: TP=the period of respiration, and TR=repetition time.

3. The magnetic resonance system of claim 1 wherein said means for reconstructing comprises means for Fourier transforming said averaged pixel data.

4. The magnetic resonance system of claim 1 wherein said
    means for reconstructing comprises means for Fourier transforming said digitized signals prior to averaging.

5. A magnetic resonance imaging method for decreasing the effect of modulation in a displayed image, wherein said modulation is produced by quasi-periodic motion of a subject being imaged to obtain magnetic resonance imaging (MRI) data, said method comprising the steps of:
    acquiring a plurality of multi-dimensional magnetic resonance signals,
    digitizing said acquired signals,
    storing said digitized signals into areas of a plurality of multi-dimensional matrices as pixel data, said areas each being defined by a specific row and a specific column, said defined areas corresponding to pixels in said displayed image,
    averaging the digitized signals from the same specific row and same specific column of each of said plurality of matrices containing said digitized signals after the pixel data is acquired for substantially all of the matrices, and reconstructing an image using the averaged digitized signals.

6. The magnetic resonance imaging method of claim 5 including: Fourier transforming said averaged digitized signals to provide imaging data for use in reconstructing said image.

7. The magnetic resonance imaging method of claim 5 including Fourier transforming said digitized signals prior to averaging.

* * * * *